United States Patent [19]

Baliga

[11] Patent Number: 4,799,095
[45] Date of Patent: Jan. 17, 1989

[54] METAL OXIDE SEMICONDUCTOR GATED TURN OFF THYRISTOR

[75] Inventor: Bantval J. Baliga, Schenectady, N.Y.

[73] Assignee: General Electric Company, Schenectady, N.Y.

[21] Appl. No.: 69,806

[22] Filed: Jul. 6, 1987

[51] Int. Cl.⁴ .................. H01L 29/74; H01L 29/78; H01L 29/06; H01L 27/02
[52] U.S. Cl. .................. 357/38; 357/23.4; 357/55; 357/46; 307/633
[58] Field of Search .................. 357/38, 38 C, 38 G, 357/38 R, 23.4, 55, 46; 307/633

[56] References Cited

U.S. PATENT DOCUMENTS

| 4,262,296 | 4/1981 | Shealy et al. | 357/55 |
| 4,334,235 | 6/1982 | Nishizawa | 357/41 |
| 4,343,015 | 8/1982 | Baliga et al. | 357/55 |
| 4,364,072 | 12/1982 | Nishizawa | 357/38 |
| 4,427,990 | 1/1984 | Nishizawa | 357/23.4 |
| 4,506,282 | 3/1985 | Baliga | 357/43 |
| 4,569,118 | 2/1986 | Baliga et al. | 29/571 |
| 4,571,815 | 2/1986 | Baliga et al. | 29/571 |
| 4,581,543 | 4/1986 | Herberg | 357/23.4 |
| 4,587,712 | 5/1986 | Baliga | 29/571 |
| 4,620,211 | 10/1986 | Baliga et al. | 357/38 |

FOREIGN PATENT DOCUMENTS 5316584  7/1976  Japan .................. 29/74

OTHER PUBLICATIONS

Temple, V.A.K., "Improved Semiconductor Devices Exhibiting Minimum On-Resistance", U.S. patent application Ser. No. 938,692 filed 12/5/86.

Primary Examiner—Martin H. Edlow
Assistant Examiner—Robert P. Limanek
Attorney, Agent, or Firm—Robert Ochis; James C. Davis, Jr.; Marvin Snyder

[57] ABSTRACT

An MOS gate turn-off thyristor structure includes non-regenerative (three-layer or transistor) portions interspersed with the four-layer regenerative (thyristor) portions and further includes gate electrode segments disposed adjacent to relatively narrow portions of the base region. Upon application of an appropriate turn-off gate bias to the gate electrode segments, the base region of the regenerative portion in which they are disposed is pinched off and the current flowing therethrough is diverted to flow through the non-regenerative portion of the structure. This interrupts regeneration in the regenerative structure and the device turns off.

25 Claims, 4 Drawing Sheets

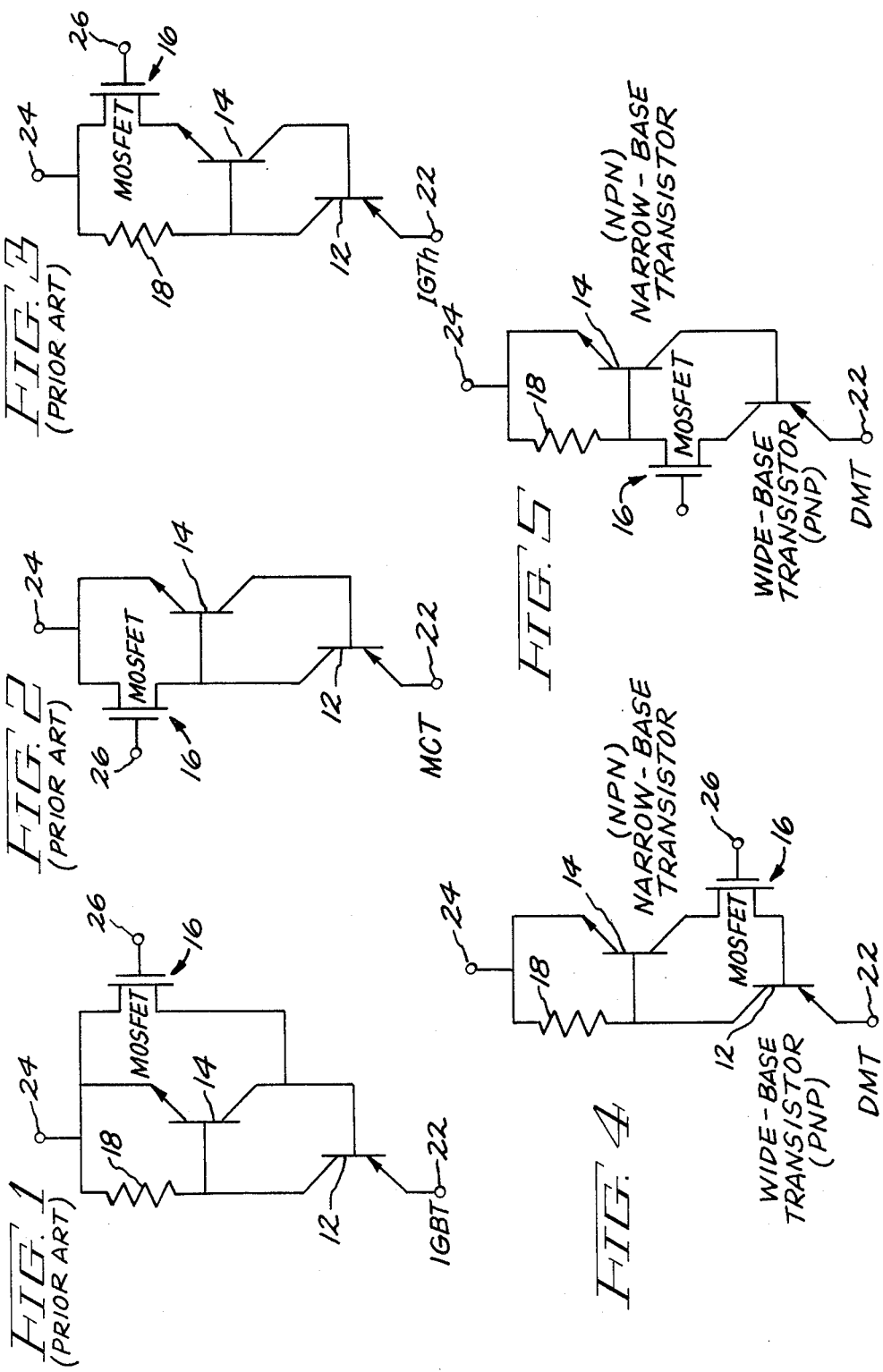

METAL OXIDE SEMICONDUCTOR GATED TURN OFF THYRISTOR

FIELD OF THE INVENTION

The present invention relates to the field of four-layer, latching, semiconductor power devices and more particularly, to such devices which may be turned off by application of a gate signal.

PRIOR ART

A wide variety of four-layer (NPNP) semiconductor devices are known which will latch in an ON condition when conducting sufficient current. This latching is a result of regenerative action which occurs between the PNP transistor and the NPN transistor which are inherent in the four layers of the device structure. Such devices are known generally as thyristors. An ideal device of this type would have no voltage drop between its main teminals in its ON state and, in response to a turn-off signal applied to a gate terminal, would be able to turn off any level of current flowing through the device. In such an ideal device, this turn-off gate signal would require no power.

Early gate turn-off thyristors employed an ohmic contact gate terminal through which enough current (typically one-third of the ON-state main current) could be extracted from the main device current path to terminate the regenerative action which maintains the latched condition. Thus, substantial power was required to control the device. Such thyristors required control circuitry capable of carrying the large currents extracted via the gate terminal.

A variety of different metal oxide semiconductor (MOS) gate-turn off thyristors have been developed in which an MOS gate is used to terminate the thyristor regeneration.

Some MOS gate turn-off thyristors establish an MOS channel which diverts current from the regenerative path of the device in order to turn the device off. The current is diverted from the regenerative path of the thyristor into a non-regenerative current path which still includes the main power electrodes.

Other MOS gate turn-off thyristors include the MOS gate channel in the thyristor current path of the device and render that channel non-coductive in order to turn the device off. Such structure has the disadvantages that the relatively high resistance of the MOS channel in series with the thyristor path increases the device forward voltage drop in the ON-state and that at the time the main current path is blocked, a high level of mobile charge is present in the device. That mobile charge limits the safe operating area (SOA) of such device when it is connected in series with an inductive load. The concurrent limits on safe values of current and voltage define the device operating region known as the SOA.

MOS gated thyristors are generally considered superior to those in which the gate is directly connected to the semiconductor material since an MOS gate does not carry the large amplitude currents which an ohmic contact gate must carry. However, there is room for improvement in the operating characteristics of such devices.

Thyristor type devices having improved operating characteristics such as lower ON-state voltage drop, higher ON-state current densities, larger SOA and the ability to turn off larger ON-state currents with minimal gate power are desirable.

It is an object of the present invention to provide an improved power semiconductor device having a thyristor-like ON-state and which includes an MOS gate that can turn off large quantities of ON-state current.

Another object is to provide a gate turn-off device having a thyristor-like ON-state and in which current diverted from the main regenerative current path to initiate turn-off continues to flow between the main power electrodes in a non-regenerative path until the device turns off.

A further object of the invention is to provide a gate turn-off device which has a thyristor section and an adjacent transistor section into which current can be diverted from the thyristor section upon interruption of the thyristor section current path.

A still further object of the invention is to provide a thyristor-like device which can be turned-off by a gate signal which causes the elimination of a current path through a base region of a thyristor portion of the device.

SUMMARY OF THE INVENTION

The foregoing objects are achieved by a semiconductor device having a regenerative or thyristor structure including first, second, third and fourth regions of alternating conductivity types arranged in series in that order. The device includes means for interrupting current flow in one of the second or third (base) regions to interrupt the regenerative action and turn the device off. In one embodiment, the device includes a three-layer non-regenerative structure disposed adjacent the regenerative structure. A four-layer regenerative (thyristor) portion of the structure latches when turned ON, thereby providing a low forward voltage drop and high current density for the overall device.

An MOS gate electrode disposed adjacent at least one of the base (second or third) regions of the regenerative portion of the structure is configured to pinch off the part of that base region which is within the regenerative portion. The non-regenerative portions of the structure (which may be three-layer or transistor portions of the device) are interspersed with the regenerative portions of the device so that when the regenerative portion of the base is pinched off, the current flowing therein is diverted into the non-regenerative portions of the device while stored charge in the base regions dissipates whereby the device turns off in a manner to provide a large safe operating area.

The non-regenerative portions of the device which are not pinched off by the gate electrode are distinct from the regenerative portions of the device because they lack the fourth (emitter) layer of the overall four-layer structure. One of the main power electrodes contacts both the fourth (emitter) layer and the third (base) layer. The gate electrode may preferably be disposed in trenches extending into the body of the semiconductor device from the surface at which the main power electrode makes contact to both the emitter and base regions. The gate electrode segments are disposed in these trenches and control conductivity within the base region of the regenerative portion between adjacent gate electrode segments. To enable the gate electrodes to pinch off all of the regenerative portions of the base region at substantially the same applied gate voltage, the gate electrode segments are preferably substantially uniformly spaced. Either no trench is created adjacent to the base of the non-regenerative (three-layer) portion of the overall structure or the gate is made ineffective for pinching off the base therein by any one of (1) providing a thicker gate oxide adjacent the three-layer sections, (2) providing the three-layer sections with a higher conductivity base region or (3) omitting the gate electrode adjacent to the base of the three-layer portion.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 1–3 schematically illustrate equivalent circuits for three prior art insulated gate devices;

FIGS. 4 and 5 schematically illustrate equivalent circuits for two different semiconductor devices in accordance with the present invention;

FIG. 10 is a sectional, partially cutaway, perspective view of a semiconductor structure for which FIG. 5 is an equivalent circuit.

DETAILED DESCRIPTION

Figure 6:
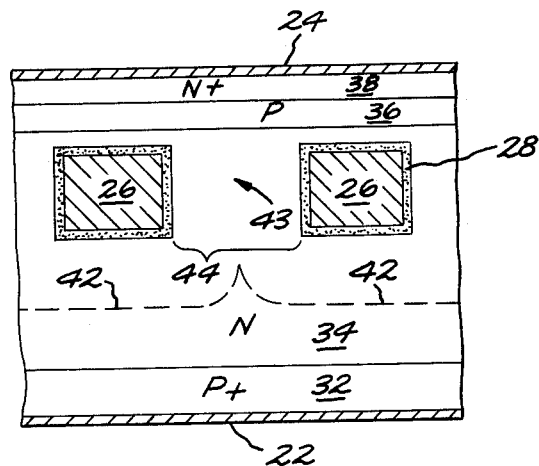
FIGS. 6 and 7 diagrammatically illustrate, in sectional view, a basic semiconductor structure having the FIG. 4 equivalent circuit.

In FIG. 1, an insulated gate bipolar transistor (IGBT) equivalent circuit is illustrated. The circuit is comprised of a PNP transistor 12, an NPN transistor 14, a metal oxide semiconductor field effect transistor (MOSFET) 16 and a resistor 18. MOSFET 16 has its source connected to the collector of the NPN transistor 14 and its drain connected to the emitter of the NPN transistor 14. Resistor 18 is connected across the base emitter junction of the NPN transistor 14. The overall device has three terminals: an anode terminal 22, a cathode terminal 24 and a gate terminal 26. Transistors 12 and 14 are connected in a regenerative fashion which, without special provision, would provide a thyristor operating characteristics. The gate for such device would be the base of transistor 14. In an IGBT, the current gain of the NPN transistor is intentionally kept small to prevent the device from latching in a thyristor-like ON condition. MOSFET 16, when turned on, supplies additional base current to PNP transistor 12 thereby producing a temporary effect similar to that of a high gain NPN transistor without, however, causing the IGBT to latch in a thyristor-like ON-state.

In FIG. 2, an MOS controlled thyristor (MCT) equivalent circuit is illustrated. This circuit comprises a PNP transistor 12, NPN transistor 14 and an MOSFET 16. Transistors 12 and 14 are connected in the same manner as they are in the IGBT equivalent circuit of FIG. 1. However, MOSFET 16 is connected between the base and emitter of NPN transistor 14 rather than between its collector and emitter. As a result of this connection, resistor 18 is omitted from the MCT structure. In the MCT, the thyristor is latched in an ON-state and turned off by turning the MOSFET on.

In FIG. 3, an insulated gate thyristor (IGTh) equivalent circuit is illustrated. This circuit also contains bipolar transistors 12 and 14 and MOSFET 16 and resistor 18. The IGth equivalent circuit has its bipolar transistors 12 and 14 connected together in the same fashion as in the IGBT and MCT equivalent circuits. However, in the IGTh circuit, the MOSFET is connected directly between the emitter of NPN transistor 14 and cathode terminal 24 of the device. Thus, the MOSFET directly controls current flow from the emitter of the NPN transistor to the cathode electrode.

In FIG. 4, one embodiment of a device in accordance with the present invention is shown in equivalent circuit form. This device, which I call a depletion mode thyristor (DMT), is represented by an equivalent circuit comprised of a wide-base PNP bipolar transistor 12, an NPN narrow-base bipolar transistor 14, a MOSFET 16 and a resistor 18. The two bipolar transistors are coupled together to form a thyristor via their internal connection in a regenerative fashion similar to that in the devices of FIGS. 1–3, with resistor 18 connected across the base emitter junction of the NPN transistor. This device differs from the devices of FIGS. 1–3 in that the FET is connected in the path between the base of PNP transistor 12 and the collector of NPN transistor 14. As shown, the DMT device is a high voltage device with the FET in the wide-base (high voltage supporting) portion of the structure.

In FIG. 5, the equivalent circuit of an alternative embodiment of a DMT device in accordance with the present invention is shown. The DMT device represented in FIG. 5 is similar to the DMT device represented in FIG. 4 with the exception that MOSFET 16 is connected in the path between the collector of PNP transistor 12 and the base of NPN transistor 14. As shown, the DMT device is a high voltage device in which the FET is in the narrow base region (the one which is not designed to hold off large voltages).

As a result of the connections of the MOSFETs in the FIGS. 4 and 5 devices, the FET controls the regenerative loop of the overall structure. Thus, if the FET is turned off, current regeneration is immediately stopped.

The device structure 30 shown in FIG. 6 has the equivalent circuit shown in FIG. 4. This DMT device comprises, from bottom to top in FIG. 6, an anode contact 22, a P+ emitter 32, an N type base or drift region 34, a P type base region 36, an N+ emitter region 38 and a cathode contact 24. The N type base or drift region 34 is the so-called wide base of the device because its width from top to bottom in FIG. 6 is made wide enough to support the maximum voltage the device is designed to hold off. Within N type drift or base region 34, a plurality of MOS gate segments 26 are disposed adjacent the base material but spaced therefrom by a gate insulator 28 which may be an oxide of the semiconductor material. The horizontal spacing in the Figure between adjacent gate segments 26 is made small enough that upon application of an appropriate control voltage, the portion of the base region situated between adjacent gate electrode segments is pinched off. This is illustrated by dashed lines 42 which mark the edges of the depletion regions induced by the different gate segments. It is the region between each gate electrode segment and dashed line 42 around it which is depleted by the gate voltage. These depletion regions induced by adjacent gate segments merge in pinch off regions 43, thereby pinching off the channel current path 44 between those gate segments. Thus, application of an appropriate turn-off gate voltage to these gate segments interrupts the current path in the base of the regenerative (thyristor) structure and breaks its regenerative action, shutting the device off. In a uniform structure of this type, there is no alternate current path, with the result that the device turn-off is abrupt. Under those circumstances, substantial excess mobile charges are present in the non-depleted portions of base region 34 at the time of turn-off. Any such excess charges eventually dissipate via recombination. This creates a disadvantage for the device when controlling an inductive load because those excess charges limit the safe operating area (SOA) of the device at the time of turn-off.

Figure 7:
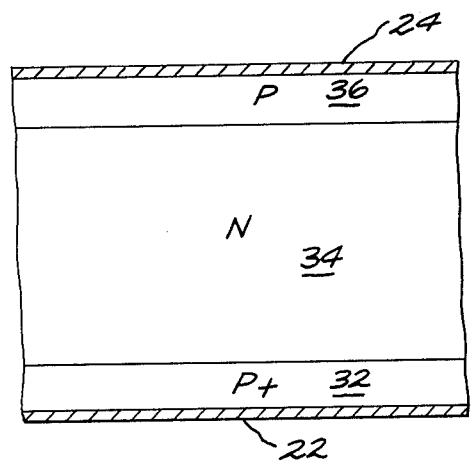

FIG. 7 is a cross-sectional view through a separate portion of a modified version of the FIG. 6 DMT device taken at a location where N+ emitter 38 and gate region 28 are omitted from the structure. The modified device also has a portion corresponding to the structure shown in FIG. 6. Thus, this device has both a regenerative portion and a non-regenerative portion. Similar regions of the modified device are indicated by the same reference numerals in FIG. 7 as in FIG. 6. It will be noted that in this three-layer portion of the structure, gate electrode 26 is not present in the base or drift region 34. This structure, or its functional equivalent, can be achieved in a number of ways. First, if desired, the oxide and the gate may both be omitted from this portion of the device (as shown) with the result that a uniform base or drift region 34 is present in the portion of the device in which only three layers are present. As an alternative, the gate oxide 28 can be made much thicker in the FIG. 7 portion of the device than it is in the FIG. 6 portion of the device. This would increase the threshold voltage for that MOS gate so that the gate cannot pinch off channel 44 at the voltages applied to the gate for pinching off the FIG. 6 portion of the structure. As a further alternative, the gate electrode material may be omitted entirely from within the oxide in the FIG. 7 portion of the device.

In operation, application of a sufficiently negative gate voltage to gate segments 26 in the aforementioned modified version of the FIG. 6 DMT device pinches off channel region 44 within the four-layer portion of the structure (FIG. 6). Since in the three-layer portion of the structure (FIG. 7) the gate electrode is missing or is spaced from the base region by a larger thickness of gate oxide, no pinch off occurs in the three-layer portion of the structure and the current which is blocked from flowing through channel 44 within the four-layer structure is diverted laterally into the three-layer structure where no regeneration occurs, with the result that the device turns off. This has the advantage that rather than current flow through the entire device being cut off abruptly while there are many excess carriers in base region 34, current flow continues through the transistor portion of the structure until those excess carriers have been removed at which time the device shuts off completely because that transistor section's only source of base current is the thyristor structure. Thus, this modified structure has a larger SOA than the FIG. 6 device.

Figure 8:
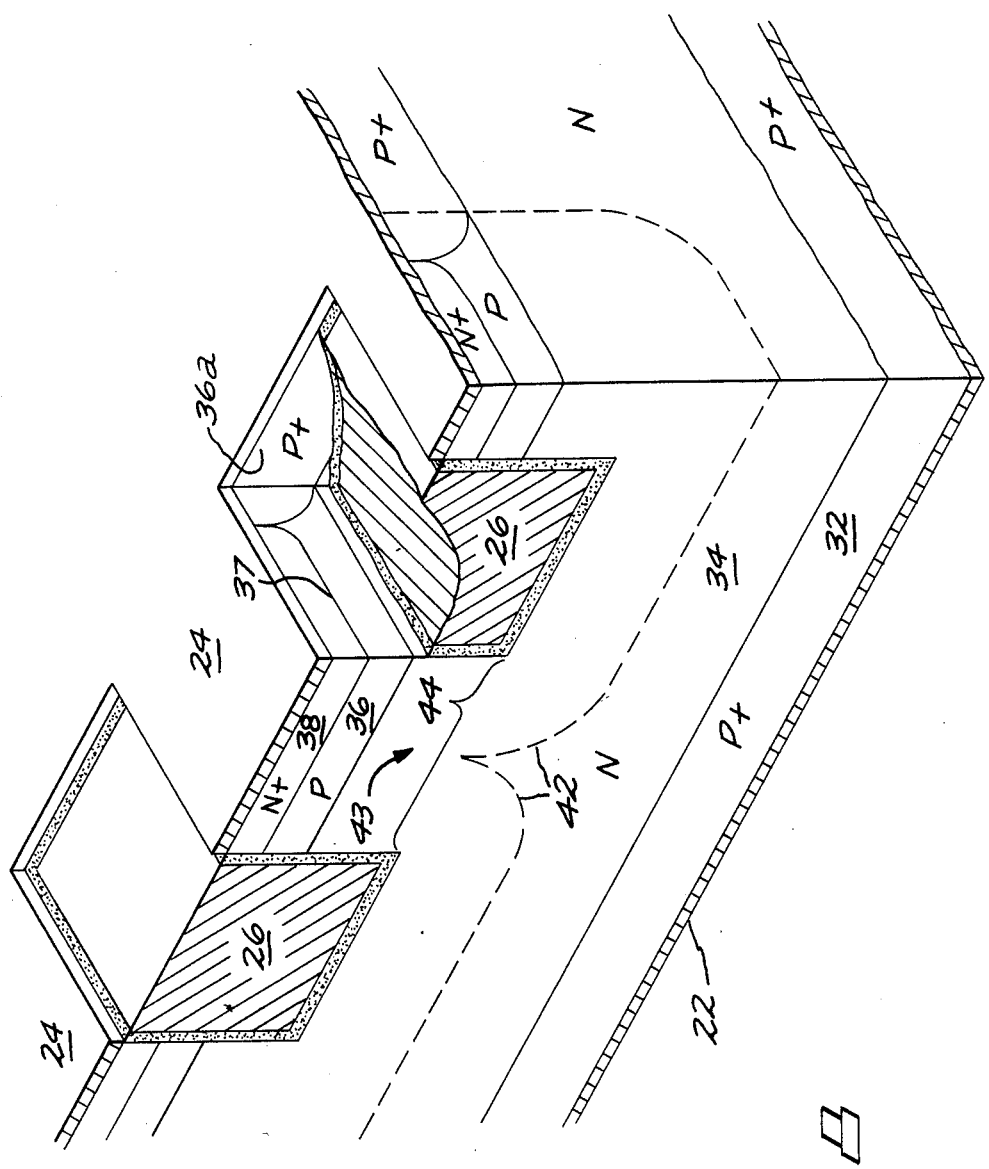
FIG. 8 is a sectional, partially cutaway, perspective view of an alternative semiconductor structure for which the Figure is an 4 equivalent circuit.

The structure illustrated in FIGS. 6 and 7 is difficult to fabricate using present semiconductor fabrication processes. Consequently, the structure illustrated in FIG. 8 is preferred. In this structure, rather than the gate oxide and gate electrode being isolated in a tunnel within the semiconductor material, a cut and filled trench is provided which extends to the upper surface of the semiconductor material. This trench may be formed by reactive ion etching (RIE) or by other techniques as desired. Once the trench is formed, its surface may be oxidized and the gate electrode deposited within the trench in order to provide the desired control over conduction within the four-layer portion of the structure. As seen toward the back part of the cutaway portion in FIG. 8, the gate electrode is omitted along the sides of the three-layer portion of the device structure, where the three-layer portion includes a P+ base region 36a instead of P base region 36. A number of techniques can be used to omit the gate electrode from the region adjacent the base of the three-layer portion of the structure. A preferred technique is to not cut the trench into that portion of the semiconductor material, so that neither the gate dielectric nor the gate electrode is present adjacent the three-layer portion of the structure and no pinch off is induced in that region. An alternative is to cut the trench across both the regenerative and the non-regenerative portions of the structure and to backfill the non-regenerative portion of the trench with an insulating layer such as silicon dioxide. A second alternative is to provide a thicker gate insulator in the non-regenerative portion of the structure. Other techniques may alternatively be used. As shown in FIG. 8, gate electrode 26 is disposed adjacent to both wide base region 34 and narrow base region 36. As has been discussed, application of an appropriate negative voltage to gate 26 results in pinch off of wide base region 34 which shuts the device off. Application of an appropriate positive voltage to gate 26 will create an inversion region in narrow base region 36 adjacent the gate electrode 26. This allows electrons to flow from emitter 38 through the inversion region into wide base region 34 where those electrons provide the base current for the inherent PNP transistor comprised of regions 32, 34 and 36. This turns the device on. Thus, the same gate electrode may be used to turn the device on and off by application of appropriate voltages to the gate. This provides the advantage of having a three-terminal device in which a single (third) terminal is used to control both turn-on and turn-off.

Figure 9:
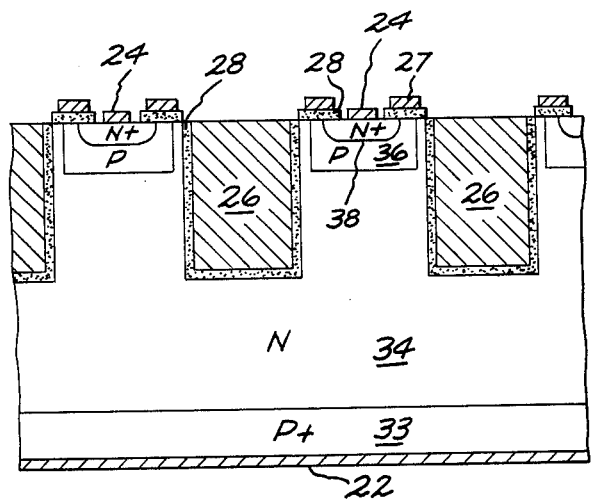
FIG. 9 diagrammatically illustrates a cross-section of an alternative embodiment of the FIG. 8 device.

An alternative device structure shown in FIG. 9 separates the turn-on and turn-off functions by providing two separate gate electrodes, one gate 26 disposed adjacent wide base 34 to turn the device off and an additional gate 27 disposed adjacent narrow base 36 to turn the device on.

Figure 10:
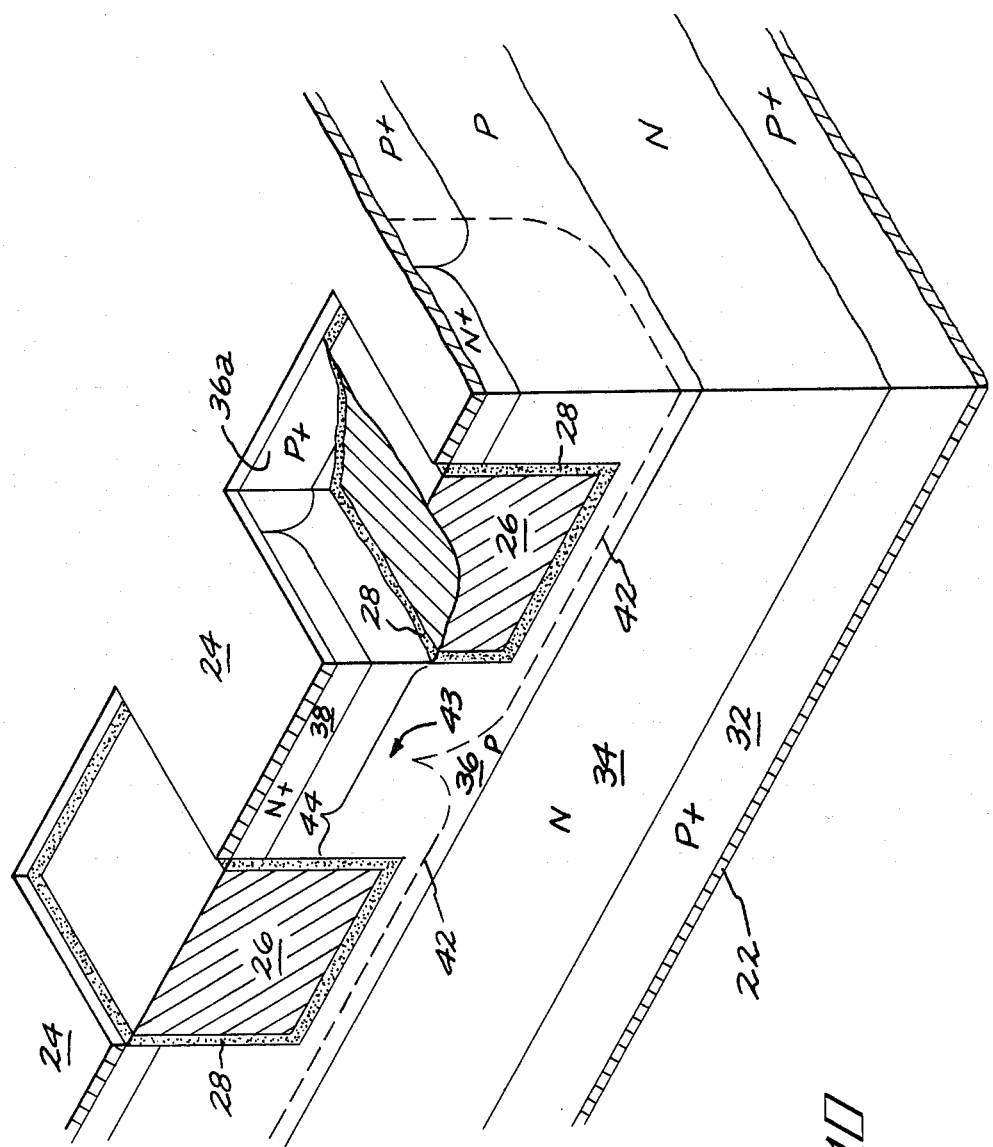

In FIG. 10, a device similar to the device of FIG. 8 is illustrated. The primary distinction of the FIG. 10 device from the FIG. 8 device is that the trenches in the FIG. 10 device extend only into the upper or P type base region 36 and do not extend into the lower or N type base region 34. Otherwise, the topology of the FIG. 10 device is similar to that of the FIG. 8 device. The equivalent circuit of the FIG. 10 device is shown in FIG. 5. A major difference between the FIG. 10 and FIG. 8 devices is that P base 36 is more heavily doped than N base 34. Consequently, a given gate voltage magnitude of appropriate sign applied to the gate of the device creates a shallower depletion region in base of 36 of the FIG. 10 device than in base 34 of the FIG. 8 device. Therefore, the pinch off portions 43 of base region 36 which space apart the gate electrode segments cannot be as wide as those segments in FIG. 8 or else a gate voltage large enough to pinch off base 36 will invert the surface of the base adjacent the gate electrode and the device will not be pinched off and will not shut off.

In FIG. 10, the gate electrode is shown adjacent to only one base region 36, 36a. Consequently, the same gate electrode cannot be used both for turn-on and turn-off and a separate turn-on mechanism must be provided. This may involve the use of light to generate hole electron pairs internally, the provision of a separate gate structure which controls a turn-on current path or other techniques known in the thyristor art.

The sign of the voltage which will result in pinch off of a base region depends on the conductivity type of the base region. Thus, in order to pinch off the N type base region as shown by dashed lines 42 in FIG. 8, a negative voltage must be applied to the gate electrode in order to deplete the N type base region adjacent the electrode. In contrast, in the FIG. 10 device, in order to pinch off P type base region 36, a positive voltage must be applied to the MOS gate in order to deplete P type region 36.

In the FIG. 8 device, the N type base region is relatively lightly doped in order to sustain a large blocking voltage. As a consequence, a substantial width of N type base region 34 can be depleted by application of a relatively low voltage to the gate electrode. In this way, base region 34 is pinched off without inducing an accumulation or inversion layer within the base region adjacent gate dielectric 28. Thus, gate turn off of the regenerative portion of the device is relatively straightforward.

When the turn-off voltage is applied to the gate electrode to turn this device off, the depletion regions induced in N base 34 spread rapidly to pinch off the part of base 34 which is within the regenerative portion of the device. Because of the regenerative action in the four-layer portion of the device, substantial quantities of excess mobile carriers are present in both base regions 34 and 36 at the time turn off is initiated. If the entire device were pinched off (as occurs in the insulated gate thyristor), these excess charges would limit the safe operating area of the device because substantial time would be required for them to recombine within the device. However, presence of the non-regenerative section of the device directly adjacent to the regenerative section provides a favorable current path for removal of this charge. Further, since only the regenerative portion of the structure is pinched off, current can continue to flow between the main terminals through the non-regenerative portion of the structure because these excess mobile charge carriers serve as the base current of the transistor portion of the structure until such time as these excess mobile charges have been swept out of the device, at which point the entire device turns off because there is no longer any mechanism for sustaining current through the non-regenerative portion of the device. As a consequence, the mobile charge level in the device is substantially reduced before the voltage across the device can rise to its full value. This results in a larger safe operating area (SOA) for the device.

In order to turn on the FIG. 8 device, gate electrode 26 is energized with a positive voltage of sufficient amplitude to invert the surface of P base region 36 adjacent the gate electrode in order to provide an electron current path from N+ emitter 38 to N base 34. A sufficient current flow will forward bias PN junction 37 between N+ emitter region 38 and P base 36. When junction 37 is forward biased, the device latches in its ON condition.

Experimental devices in accordance with the FIG. 8 embodiment have been built and tested. These non-optimized devices had the following characteristics.

P+ emitter doping: $10^{19}$ per $cm^3$
N base doping: $10^{14}$ per $cm^3$
P base doping: $10^{16}$ per $cm^3$
N+ emitter doping: $10^{20}$ per $cm^2$
% active area four layer: 80
% active area three layer: 20
Width of pinch-off portion of N base: 3 microns
Thickness of N base: 50 microns
Maximum holdoff voltage: 500 volts
Latching current: density-10 A/$cm^2$
Forward voltage drop: 1 volt
Turn-on gate voltage: 10 volts
Turn-off gate voltage: −15 volts
Turn-off time: 5 microseconds
Maximum controllable (turn-off) current density: 5,000 A/$cm^2$ Device fabrication tolerances are substantially more stringent in the case of the FIG. 9 device because P base region 36 is substantially more heavily doped than N base region 34. As a result, the segments of gate electrode 26 must be placed substantially closer together in the FIG. 9 device than required in the FIG. 8 device in order to enable gate electrode 26 to pinch off P base region 36. In addition, because of the relatively heavy doping of P base region 36, a substantial positive voltage must be applied to the gate electrode in order to pinch off the P base region. Consequently, care must be taken in device design and fabrication to ensure that any inversion region which the turn-off voltage induces in the P base region adjacent gate dielectric 28 does not result in device turn on. Accordingly, a separate turn-on mechanism, i.e., gate 27, should be provided in order to turn on the FIG. 9 device structure.

Many variations can be made in these device structures without departing from the scope and spirit of the invention. For example, the conductivity type of all regions in any given device may be reversed with the result that the device of opposite conductivity type is provided. Other means for interrupting the base current path may be provided. While the devices shown have been described as being depletion mode devices (the pinch-off region being conductive with zero volt gate bias), they can also operate in an enhancement mode (the pinch-off region being non-conductive at zero gate voltage) provided the doping concentration in the pinch-off region is low enough.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. In a thyristor containing therein a plurality of semiconductor regions forming two, merged, but separately identifiable bipolar transistors, the collector of one transistor being coupled to the base of the second transistor and the base of the one transistor being coupled to the collector of the second transistor, the improvement comprising:
   insulated gate means coupled to the base of one of said two bipolar transistors for interrupting the current path in the base of said one of said two bipolar transistors.

2. The device of claim 1 wherein said insulated gate means operates in a depletion mode.

3. The device of claim 1 wherein said insulated gate means operates in an enhancement mode.

4. A semiconductor device comprising:
a body of semiconductor material having first and second opposed major surfaces and including a regenerative structure comprising:
a first emitter region of one type conductivity extending to said first surface,
a first base region of opposite type conductivity, disposed adjacent to and forming a first PN junction with said first emitter region,
a second bae region of said one type conductivity disposed adjacent to said first base region, forming a second PN junction with said first base region and spaced from said first emitter region by said first base region, and
a second emitter region of said opposite type conductivity disposed adjacent to said second base region, forming a third PN junction with said second base region, spaced from said first base region by said second base region and extending to said second surface; and
means for, when said device is operating in a regenerative mode, interrupting the current path in a first one of said base regions in said regenerative structure to turn said device off.

5. The semiconductor device recited in claim 4 wherein said means for interrupting current flow comprises an insulated gate electrode disposed adjacent to a pinch-off portion of said first one of said base regions, said pinch-off portion being narrow enough that upon application of an appropriate turn-off bias voltage to said gate electrode, said pinch-off portion of said one of said base regions is sufficiently depleted of carriers to cause said device to turn off.

6. The semiconductor device recited in claim 5 further comprising:
first and second power electrodes respectively disposed on said first and second surfaces and ohmically contacting said first and second emitter regions; and
a non-regenerative three layer portion from which either said first emitter region is omitted and in which said first power electrode also ohmically contacts said first base region, or said second emitter region is omitted and in which said second power electrode also ohmically contacts said second base region, such that said regenerative four-layer portion and said non-regenerative three-layer portion are both connected between said first and second power electrodes, whereby when current is flowing between said first and second power electrodes through said regenerative portion in a regenerative thyristor mode, application of said appropriate turn-off bias voltage to said insulated gate electrode sufficiently pinches off said pinch-off portion of said first one of said base regions to divert enough of said current from said regenerative portion of said device into said non-regenerative portion of said device to interrupt the regenerative thyristor action of said regenerative portion of said device and to turn said device off.

7. The semiconductor device recited in claim 6 wherein:
a portion of said second base region extends to said second surface of said body; and
said insulated gate electrode is disposed adjacent at least part of said second base region where said second base region extends to said second surface.

8. The semiconductor device recited in claim 7 wherein:
said second surface includes a plane portion and a trench portion, said trench portion comprising said second surface of said body where a trench extends into said body from said plane portion;
said second base region extends to said trench portion of said second surface; and
said trench contains a segment of said insulated gate electrode therein disposed adjacent to a respective portion of said second base region which extends to said second surface.

9. The semiconductor device recited in claim 8 wherein:
said first base region extends to said second surface in said trench; and
said insulated gate electrode segment disposed in said trench is also disposed adjacent said first base region in said trench.

10. The semiconductor device recited in claim 9 wherein:
said first one of said base regions is said first base region.

11. The semiconductor device recited in claim 7 wherein:
said first one of said base regions is said first base region;
said second surface includes a substantially planar portion and a trench portion, said trench portion comprising said second surface of said body where a trench extends into said body from said plane portion;
said first base region extends to said trench portion of said second surface; and
said trench contains a segment of said insulated gate electrode therein disposed adjacent a respective portion of said first base region which extends to said second surface.

12. The semiconductor device recited in claim 4 wherein:
each of said emitter regions has a conductivity type determining dopant concentration which is at least one hundred times the conductivity type determining dopant concentration in either of said base regions in said regenerative portion of said device.

13. The semiconductor device recited in claim 4 wherein:
said first one of said base regions is said first base region.

14. The semiconductor device recited in claim 4 wherein:
said first one of said base regions is said second base region.

15. The semiconductor device recited in claim 4 wherein said first base region comprises a wide base region and said second base region comprises a narrow base region.

16. The semiconductor device recited in claim 15 wherein said first one of said base regions is said first base region.

17. The semiconductor device recited in claim 15 wherein said first one of said base regions is said second base region.

18. The semiconductor device recited in claim 15 wherein:

said first one of said base regions is said first base region; and said device further includes an insulated gate electrode disposed adjacent said first and second base regions whereby application of an appropriate turn-on bias voltage to said insulated gate electrode can turn said device on by allowing conduction in said second base region adjacent to said insulated gate electrode to provide base current from said second emitter region to an inherent transistor comprised of said first emitter, first base and second base regions.

19. The semiconductor device recited in claim 15 wherein:

said first one of said base regions is said first base region; and said device further includes:
a first insulated gate electrode disposed adjacent said first base region, and
a second insulated gate electrode disposed adjacent said second base region whereby application of an appropriate turn-on bias voltage to said second insulated gate electrode can turn said device on by allowing conduction in said second base region adjacent said second insulated gate electrode to provide base current from said second emitter region to an inherent bipolar transistor comprised of said first emitter, first base and second base regions.

20. A semiconductor device comprising:
a body of semiconductor material including a regenerative portion and an adjacent non-regenerative portion, said regenerative portion including adjoining first, second, third and fourth regions of alternating conductivity type disposed in series in that order; and
means for pinching off one of said second and third regions in said regenerative portion to divert current from said regenerative portion into said adjacent non-regenerative portion to turn said device off.

21. The semiconductor device recited in claim 20 wherein:

when said one of said second and third regions in said regenerative portion is pinched off, substantially all of the current within said regenerative portion is diverted into said non-regenerative portion.

22. The semiconductor device recited in claim 21 wherein:

said non-regenerative portion comprises three of said four regions present in said regenerative portion.

23. The semiconductor device recited in claim 21 wherein:

said means for pinching off comprises an insulated gate electrode disposed adjacent said one of said second and third regions in said regenerative portion where said one region is thin enough that an appropriate turn-off bias voltage applied to said insulated gate electrode will pinch off said one region in said regenerative portion to a sufficient extent to divert enough current from said regenerative portion into said non-regenerative portion to turn said device off.

24. In a thyristor containing therein a plurality of semiconductor regions forming two, merged, but separately identifiable bipolar transistors, the collector of one transistor being coupled to the base of the second transistor and the base of the one transistor being coupled to the collector of the second transistor, the improvement comprising:
insulated gate means coupled to the base of one of said two bipolar transistors for blocking the base current of said one of said two bipolar transistors.

25. A semiconductor device comprising:
a body of semiconductor material having first and second opposed major surfaces and including a regenerative structure comprising:
a first emitter region of one type conductivity extending to said first surface;
a first base region of opposite type conductivity, disposed adjacent to and forming a first PN junction with said first emitter region,
a second base region of said one type conductivity disposed adjacent to said first base region, forming a second PN junction with said first base region and spaced from said first emitter region by said first base region, and
a second emitter region of said opposite type conductivity disposed adjacent to said second base region, forming a third PN junction with said second base region, spaced from said first base region by said second base region and extending to said second surface; and
means for turning off said device when said device is operating in a regenerating mode by blocking current flow in one of said base regions in said regenerative structure.

* * * * *